(12) United States Patent
Yamazaki

(10) Patent No.: US 8,872,174 B2
(45) Date of Patent: Oct. 28, 2014

(54) LIGHT-EMITTING DEVICE

(71) Applicant: Semiconductor Energy Laboratory Co., Ltd., Atsugi (JP)

(72) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/897,501

(22) Filed: May 20, 2013

(65) Prior Publication Data

US 2013/0320331 A1 Dec. 5, 2013

(30) Foreign Application Priority Data

Jun. 1, 2012 (JP) ................................. 2012-126592

(51) Int. Cl.

| | | |
|---|---|---|
| H01L 29/10 | (2006.01) | |
| H01L 29/12 | (2006.01) | |
| H01L 33/30 | (2010.01) | |
| H01L 33/32 | (2010.01) | |
| H01L 33/00 | (2010.01) | |
| H01L 33/16 | (2010.01) | |

(52) U.S. Cl.
CPC ............... *H01L 33/30* (2013.01); *H01L 33/32* (2013.01); *H01L 33/0066* (2013.01); *H01L 33/16* (2013.01)
USPC ......................................................... 257/43

(58) Field of Classification Search
USPC .................... 257/40, 79–103, 918, 257/E51.018–E51.022, E33.001–E33.077, 257/E33.054, E23.028, E25.032, E31.058, 257/E31.063, E31.115, E27.133–E27.139, 257/252–254, 257–258, 458, 656, E29.336, 257/E31.036, E31.087–E31.088, 257/E31.061–E31.062, 192, 257/E29.246–E29.253, E21.403, E21.407, 257/194, 285, 9–39, E39.003, 257/E39.012–E39.015, E29.042, E29.179, 257/642–643, 759, E51.001–E51.052, 257/E25.008–E25.009, E29.069–E29.071, 257/E29.245, E49.001–E49.004, E21.404; 438/22–47, 69, 493, 503, 507, 956, 438/183, 926, 167, 172, 292–308, 82, 99, 438/16, 65

See application file for complete search history.

(56) References Cited

U.S. PATENT DOCUMENTS

| 4,243,697 A | * | 1/1981 | Glass et al. ................... 427/547 |
|---|---|---|---|
| 5,731,856 A | | 3/1998 | Kim et al. |

(Continued)

FOREIGN PATENT DOCUMENTS

| EP | 1737044 A | 12/2006 |
|---|---|---|
| EP | 2226847 A | 9/2010 |

(Continued)

OTHER PUBLICATIONS

S. J. Pearton et al., "GaN: Processing, defects, and devices," Journal of Applied Physics, Jul. 1, 1999, vol. 86, No. 1, pp. 1-78.

(Continued)

*Primary Examiner* — Dao H Nguyen
*Assistant Examiner* — Tram H Nguyen
(74) *Attorney, Agent, or Firm* — Eric J. Robinson; Robinson Intellectual Property Law Office, P.C.

(57) ABSTRACT

To provide a novel light-emitting device that can be manufactured with high productivity. In a light-emitting device in which a light-emitting diode (LED) layer is provided over a substrate, a metal oxide semiconductor (c-axis aligned crystalline oxide semiconductor (CAAC-OS)) substrate including a crystal part having a c-axis which is substantially perpendicular to a surface of the substrate is used as the substrate. The substrate may have either a single-layer structure of a CAAC-OS substrate or a structure in which a thin CAAC-OS substrate is stacked over a base substrate.

18 Claims, 4 Drawing Sheets

(56) References Cited

U.S. PATENT DOCUMENTS

| | | |
|---|---|---|
| 5,744,864 A | 4/1998 | Cillessen et al. |
| 6,156,581 A | 12/2000 | Vaudo et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 * | 6/2006 | Kawasaki et al. .............. 257/43 |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0270548 A1 * | 10/2010 | Ikemoto et al. ................. 257/43 |
| 2011/0101372 A1 * | 5/2011 | Oya et al. ........................ 257/76 |
| 2011/0315998 A1 * | 12/2011 | Hashimoto et al. ............. 257/76 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-119423 A | 4/2004 |
| JP | 2004-273614 A | 9/2004 |
| JP | 2004-273732 A | 9/2004 |
| JP | 2010-183026 A | 8/2010 |
| WO | WO-2004/114391 | 12/2004 |

OTHER PUBLICATIONS

Fortunato.E et al., "Wide-Bandgap High-Mobility ZNO Thin-Film Transistors Produced at room temperature,", App. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

(56) References Cited

OTHER PUBLICATIONS

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3-Ga2ZnO4-ZnO system at 1350° C,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA Amoled Driven by the Threshold Voltage Controlled Amorphous Gizo (Ga2O3-In2O3-ZnO) TFT,", SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K at al., "Ultra Low Power Consumption Technologies for Mobile TFT-LCDs,", IDW '02 : Proceedings of the 9th International Display Workshops, Dec. 4, 2002. pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Tecnical Papers, Jul. 1, 2009, pp. 227-230, The Japan Society of Applied Physics.

Coates.D. et al., "Optical Studies of the Amorphous Liquid-Cholestric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009 pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID Internationl Symposium Digest of Technical Papers, May 31, 2009, pp. 983-985.

Sakata.J. et al., "Development of 4.0-In. Amoled Display With Driver Circuit Using Amorphous In-Ga-Zn-Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZNO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,". AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID International Symposium Digest of Technical Papers, 2007, vol. 38, pp. 1830-1833.

Godo.H. et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 IN. QVGA Amoled Display Using In-Ga-Zn-Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

(56) References Cited

OTHER PUBLICATIONS

Nakamura.M, "Synthesis of Homologous Compound with New Long-Period Structure,", NIRIM Newsletter, Mar. 1, 1995, vol. 50, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel, YBFE2O4, and YB2FE3O7 Types of Structures for Compounds in the IN2O3 and SC2O3-A2O3-BO Systems [A; FE, GA, OR AL; B: MG, MN, FE, NI, CU,OR ZN] at Temperatures Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AMOLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B) Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008 vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solida), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 112, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

LIGHT-EMITTING DEVICE

BACKGROUND OF THE INVENTION

1. Field of the Invention

The present invention relates to a light-emitting device and a method for manufacturing the light-emitting device.

2. Description of the Related Art

A light-emitting diode (LED) using gallium nitride has been developed actively and has been increasingly practically used for a lighting device or the like.

Characteristics of a light-emitting device, such as emission efficiency and durability life, are greatly affected by the crystal quality of a light-emitting layer. As a substrate included in a light-emitting device, an inexpensive sapphire substrate or the like is often used; however, the crystal quality of a light-emitting layer depends on a substrate where the light-emitting layer is formed. Therefore, a gallium nitride single crystal substrate has been researched as a substrate for a light-emitting device with which a light-emitting layer having favorable crystal quality is obtained (for example, see Patent Document 1).

Further, a gallium-nitride-based light-emitting diode which uses a gallium oxide substrate whose main surface is formed of single crystal gallium oxide has been also researched and developed (for example, see Patent Document 2).

REFERENCE

Patent Documents

[Patent Document 1] Japanese Published Patent Application No. 2004-119423
[Patent Document 2] Japanese Published Patent Application No. 2010-183026

SUMMARY OF THE INVENTION

For manufacture of a gallium nitride substrate or a gallium oxide substrate which is used as a substrate for manufacturing a light-emitting device, the following process is needed: a single crystal film is grown in order to form a crystal surface which is epitaxially grown.

The present invention has been made in view of the above-described situation. An object of one embodiment of the present invention is to provide a novel light-emitting device that can be manufactured with high productivity.

In one embodiment of the present invention, a substrate of a metal oxide semiconductor including a c-axis-aligned crystal region (c-axis aligned crystalline oxide semiconductor (CAAC-OS)) is used as a supporting substrate of a light-emitting device. In the c-axis-aligned crystal region, a c-axis is aligned in a direction substantially perpendicular to a surface of the supporting substrate of a metal oxide semiconductor. In this specification, an oxide semiconductor substrate including a crystal part whose c-axis is substantially perpendicular to a surface of the oxide semiconductor substrate is referred to as CAAC-OS substrate. Note that in this specification, a CAAC-OS substrate includes a CAAC-OS film (layer).

For example, as a CAAC-OS, a CAAC-OS containing gallium, a CAAC-OS containing indium and gallium, a CAAC-OS containing indium, gallium, and zinc, or the like can be used.

A substrate of a light-emitting device may have either a single-layer structure of a CAAC-OS substrate or a structure in which a thin CAAC-OS substrate is stacked over a base substrate such as a sapphire substrate or an yttria-stabilized zirconia (YSZ) substrate.

The CAAC-OS substrate is subjected to heat treatment at a high temperature of approximately 700° C. to 1500° C. in manufacture. The heat treatment can be performed under a nitrogen atmosphere or an atmosphere of nitrogen and ammonia. Further, the heat treatment may be performed under both a nitrogen atmosphere and an oxygen atmosphere.

Accordingly, the CAAC-OS substrate can be formed in a relatively simple manufacturing process and has favorable crystal quality.

For a light-emitting diode (LED) layer, a Group 13-15 compound semiconductor (a Group III-V compound semiconductor) can be used. It is preferable that the LED layer include a pair of clad layers between which a light-emitting layer is interposed and that a buffer layer be provided between the LED layer and the CAAC-OS substrate. Further, the LED layer is interposed between a first electrode layer and a second electrode layer. The buffer layer is a film having a function of reducing lattice mismatch in the case where the lattice constant of the CAAC-OS substrate is different from that of the light-emitting diode layer (the clad layer). The buffer layer can be formed using the same kind of Group 13-15 compound semiconductor as the LED layer.

One embodiment of the invention disclosed in this specification is a light-emitting device in which a light-emitting diode layer is provided over a metal oxide semiconductor substrate and the metal oxide semiconductor substrate includes a crystal part having a c-axis which is substantially perpendicular to a surface of the metal oxide semiconductor substrate.

Another embodiment of the invention disclosed in this specification is a light-emitting device including a buffer layer between the metal oxide semiconductor substrate and the light-emitting diode layer in the above-described structure.

Another embodiment of the invention disclosed in this specification is a light-emitting device in which the metal oxide semiconductor substrate is provided over a base substrate in the above-described structure.

Another embodiment of the invention disclosed in this specification is a light-emitting device in which the light-emitting diode layer includes a first clad layer, a light-emitting layer, and a second clad layer which are stacked in this order and the first clad layer, the light-emitting layer, and the second clad layer each include a Group 13-15 compound semiconductor in the above-described structure.

Another embodiment of the invention disclosed in this specification is a light-emitting device in which the light-emitting diode layer includes a first clad layer, a light-emitting layer, and a second clad layer which are stacked in this order over the metal oxide semiconductor substrate, the first clad layer includes an n-type Group 13-15 compound semiconductor, the light-emitting layer includes a Group 13-15 compound semiconductor, and the second clad layer includes a p-type Group 13-15 compound semiconductor in the above-described structure.

Another embodiment of the invention disclosed in this specification provides an electronic device including the light-emitting device.

A CAAC-OS substrate over which an LED layer is provided can be formed in a relatively simple manufacturing process and has favorable crystal quality.

Accordingly, a novel light-emitting device that can be manufactured with high productivity can be provided.

DETAILED DESCRIPTION OF THE INVENTION

Figure 1:
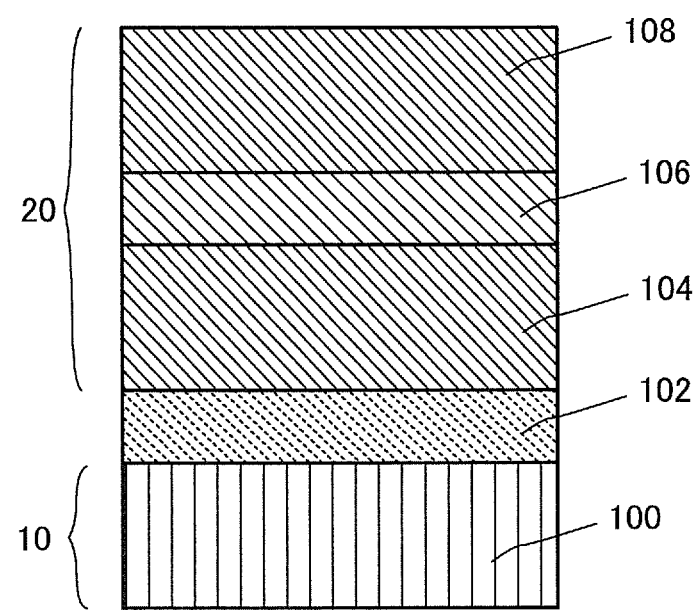
FIG. 1 is a diagram illustrating one embodiment of a light-emitting device.

Embodiments will be described in detail with reference to the drawings. Note that the present invention is not limited to the following description, and it will be easily understood by those skilled in the art that modes and details can be modified in various ways without departing from the spirit and scope of the present invention. Therefore, the present invention should not be construed as being limited to the description of the following embodiments. In the structures to be given below, the same portions or portions having similar functions are denoted by the same reference numerals in different drawings, and explanation thereof will not be repeated.

Note that the ordinal numbers such as "first", "second", and "third" in this specification are used for convenience and do not denote the order of steps and the stacking order of layers. In addition, the ordinal numbers in this specification do not denote particular names which specify the present invention.

Embodiment 1

A light-emitting device of one embodiment of the present invention is described with reference to FIG. 1 and FIG. 2.

FIG. 1 illustrates a light-emitting device in which an LED layer 20 where a first clad layer 104, a light-emitting layer 106, and a second clad layer 108 are stacked in this order is provided over a CAAC-OS substrate 100 which is a substrate 10 of the light-emitting device with a buffer layer 102 interposed therebetween.

Figure 2:
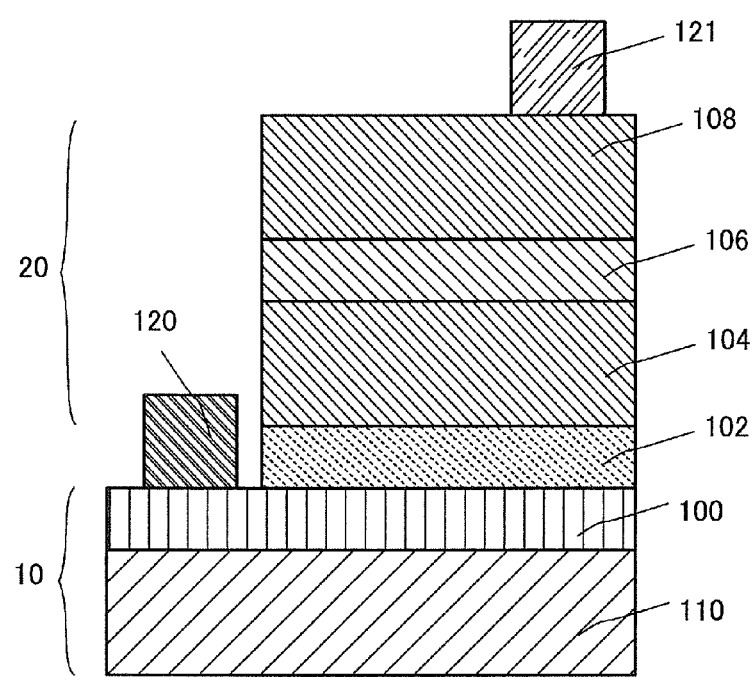
FIG. 2 is a diagram illustrating one embodiment of a light-emitting device.

FIG. 2 illustrates a light-emitting device in which the LED layer 20 where the first clad layer 104, the light-emitting layer 106, and the second clad layer 108 are stacked in this order is provided over a base substrate 110 and the CAAC-OS substrate 100 which are the substrate 10 of the light-emitting device with the buffer layer 102 interposed therebetween, a first electrode layer 120 is provided over the base substrate 110, and a second electrode layer 121 is provided over the second clad layer 108.

The substrate 10 may have either a single-layer structure of the CAAC-OS substrate as illustrated in FIG. 1 or a structure in which the CAAC-OS substrate 100 is stacked over the base substrate 110 such as a sapphire substrate or an yttria-stabilized zirconia (YSZ) substrate as illustrated in FIG. 2.

For the CAAC-OS substrate 100, a CAAC-OS containing gallium, a CAAC-OS containing indium and gallium, a CAAC-OS containing indium, gallium, and zinc, or the like can be used.

Further, the CAAC-OS substrate 100 is subjected to heat treatment at a high temperature of approximately 700° C. to 1500° C. in manufacture. Indium, zinc, or the like is evaporated (released) to the outside of the substrate by the heat treatment in some cases. As a result of this, in the formed CAAC-OS substrate 100, the contents of indium and zinc may be very small as compared to the content of gallium.

A Group 13-15 compound semiconductor can be used for each of the layers included in the LED layer 20.

The buffer layer 102 is a film having a function of reducing lattice mismatch in the case where the lattice constant of the CAAC-OS substrate 100 is different from that of the LED layer 20 (the first clad layer 104). The buffer layer 102 can be formed using the same kind of Group 13-15 compound semiconductor as the LED layer 20.

A Group 13-15 compound semiconductor (a Group III-V compound semiconductor) is a semiconductor including a Group 13 element and a Group 15 element in combination. As a Group 13 element, aluminum, gallium, indium, or the like can be used. As a Group 15 element, nitrogen, phosphorus, arsenic, antimony, or the like can be used. Further, boron, thallium, or bismuth can be also used as an element included in a Group 13-15 compound semiconductor. Further, gallium nitride, aluminum nitride, indium nitride, or the like which contains nitrogen is also referred to as a nitride semiconductor.

In this embodiment, gallium nitride is used as a Group 13-15 compound semiconductor. A gallium nitride film, an n-type gallium nitride film, a gallium nitride film, and a p-type gallium nitride film are used as the buffer layer 102, the first clad layer 104, the light-emitting layer 106, and the second clad layer, respectively.

For example, a gallium nitride film, an n-type gallium nitride film (a gallium nitride film to which silicon is added), an indium gallium nitride film, and a p-type gallium nitride film (a gallium nitride film to which magnesium is added) can be used as the buffer layer 102, the first clad layer 104, the light-emitting layer 106, and the second clad layer, respectively. Further, an aluminum gallium nitride film to which magnesium is added may be used as the second clad layer.

A Group 13-15 compound semiconductor film can be formed by a vapor deposition method such as a metal organic chemical vapor deposition (MOCVD) method, a hydride vapor phase epitaxy (VPE) method, or a molecular beam epitaxy (MBE) method.

Further, in FIG. 2, the first electrode layer 120 and the second electrode layer 121 serve as a cathode and an anode, respectively. For each of the first electrode layer 120 and the second electrode layer 121, an oxide conductive film or a metal film can be used. The first electrode layer 120 and the second electrode layer 121 may be formed with the use of, for example, one or more of the following: an indium tin oxide, a conductive material in which zinc oxide is mixed into indium oxide, a conductive material in which silicon oxide is mixed into indium oxide, organoindium, organotin, an indium oxide containing tungsten oxide, an indium zinc oxide containing tungsten oxide, an indium oxide containing titanium oxide, and an indium tin oxide containing titanium oxide; graphene; metals such as tungsten, molybdenum, zirconium, hafnium, vanadium, niobium, tantalum, chromium, cobalt, nickel, titanium, platinum, aluminum, copper, and silver; alloys thereof; and metal nitrides thereof.

A CAAC-OS which can be used for the CAAC-OS substrate 100 includes a plurality of crystal parts, and the crystal grain boundary is unclear. Note that in most cases, each of the crystal parts in the CAAC-OS fits inside a cube whose one side is less than 100 nm. In an image obtained with a transmission electron microscope (TEM), a boundary between crystal parts in the CAAC-OS is not clearly detected. Further, with the TEM, a grain boundary in the CAAC-OS is not found. Thus, in the CAAC-OS, a reduction in electron mobility, due to the grain boundary, is suppressed.

For example, the CAAC-OS includes a plurality of crystal parts. In the plurality of crystal parts, c-axes are aligned in a direction parallel to a normal vector of a surface where the CAAC-OS is formed or a normal vector of a surface of the CAAC-OS in some cases. When the CAAC-OS is analyzed by an out-of-plane method with an X-ray diffraction (XRD) apparatus, a peak appears at 2θ of around 31° in some cases. In the case of a crystal of InGaZnO$_4$, the peak at 2θ of around 31° indicates that the crystal of InGaZnO$_4$ has (009) plane alignment. Further, in the CAAC-OS, a peak appears at 2θ of around 36° in some cases. In the case of a crystal of Ga$_2$ZnO$_4$, the peak at 2θ of around 36° indicates that the crystal of Ga$_2$ZnO$_4$ has (222) plane alignment. In the CAAC-OS, it is preferable that the peak appear at 2θ of around 31° and do not appear at 2θ=around 36°.

In the CAAC-OS, for example, among crystal parts, the directions of the a-axis and the b-axis of one crystal part are different from those of another crystal part, in some cases. For example, when the CAAC-OS including a crystal of InGaZnO$_4$ is analyzed with an X-ray diffractometer by an in-plane method in which an X-ray enters a sample in a direction perpendicular to the c-axis, a peak appears at 2θ of around 56° in some cases. The peak at 2θ of around 56° is a diffraction peak of the (110) plane of a crystal of InGaZnO$_4$. Here, when 2θ is fixed at around 56°, a sample is rotated using a normal vector of a surface of the sample as an axis (φ axis), and analysis (φ scan) is performed, although six peaks having symmetry appear in the case of a single crystal oxide semiconductor in which the directions of an a-axis and a b-axis of one crystal part are the same as those of another crystal part, a peak is not clearly observed in the case of the CAAC-OS.

As described above, in the CAAC-OS, for example, c-axes are aligned, and a-axes and/or b-axes are not macroscopically aligned, in some cases.

In each of the crystal parts included in the CAAC-OS, a c-axis is aligned in a direction parallel to a normal vector of a surface where the CAAC-OS is formed or a normal vector of a surface of the CAAC-OS, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

The CAAC-OS includes the plurality of crystal parts. Since the c-axes of the crystal parts included in the CAAC-OS are aligned in the direction parallel to a normal vector of a surface where the CAAC-OS is formed or a normal vector of a surface of the CAAC-OS, the directions of the c-axes of the crystal parts may be different from each other depending on the shape of the CAAC-OS (the cross-sectional shape of the surface where the CAAC-OS is formed or the cross-sectional shape of the surface of the CAAC-OS). Note that when the CAAC-OS is formed, the direction of c-axis of the crystal part is the direction parallel to a normal vector of the surface where the CAAC-OS is formed or a normal vector of the surface of the CAAC-OS. The crystal part is formed by deposition or by performing treatment for crystallization such as heat treatment after deposition.

In the CAAC-OS, distribution of crystal parts is not necessarily uniform. For example, in the formation process of the CAAC-OS, in the case where crystal growth occurs from a surface side of the oxide semiconductor, the proportion of crystal parts in the vicinity of the surface of the oxide semiconductor film is higher than that in the vicinity of the surface where the oxide semiconductor film is formed in some cases.

For an oxide semiconductor used for the CAAC-OS, a gallium oxide, an In—Ga-based oxide, an In—Ga—Zn-based oxide (also referred to as IGZO), or the like can be used.

Note that here, for example, an "In—Ga—Zn-based oxide" means an oxide containing In, Ga, and Zn as its main components and there is no particular limitation on the ratio of In, Ga, and Zn. The In—Ga—Zn-based oxide may contain a metal element other than In, Ga, and Zn.

For example, an In—Ga—Zn-based oxide with an atomic ratio of In:Ga:Zn=1:1:1 (=1/3:1/3:1/3), In:Ga:Zn=2:2:1 (=2/5:2/5:1/5), In:Ga:Zn=3:1:2 (=1/2:1/6:1/3), or any of oxides whose composition is in the neighborhood of the above compositions can be used.

Note that for example, in the case where the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1), a, b, and c satisfy the following relation: $(a-A)^2+(b-B)^2+(c-C)^2 \leq r^2$, and r may be 0.05, and r may be 0.05, for example. The same applies to other oxides.

Nitrogen may be substituted for part of constituent oxygen of the oxide semiconductor.

The CAAC-OS substrate 100 of the invention disclosed in this specification can be formed by a sputtering method, a molecular beam epitaxy (MBE) method, a CVD method, a pulse laser deposition method, an atomic layer deposition (ALD) method, or the like. The CAAC-OS substrate 100 may also be formed with a sputtering apparatus which performs film deposition with surfaces of a plurality of substrates set substantially perpendicular to a surface of a sputtering target. The CAAC-OS substrate 100 can be formed, for example, by any of the following methods: a method for forming a crystal part which is c-axis-aligned in a direction substantially perpendicular to a surface of the oxide semiconductor film by performing deposition while heat treatment is performed; a method for forming a crystal part which is c-axis-aligned in a direction substantially perpendicular to the surface of the oxide semiconductor film by crystallization treatment such as heat treatment after the deposition; and a method for forming the CAAC-OS substrate 100 including a crystal part which is c-axis-aligned in a direction substantially perpendicular to the surface of the CAAC-OS substrate 100 by depositing a film over a CAAC-OS film.

The CAAC-OS substrate 100 can be also formed in such a manner that a CAAC-OS film is deposited and after that, heat treatment is performed at a high temperature of approximately 700° C. to 1500° C. The heat treatment can be performed under a nitrogen atmosphere or an atmosphere of nitrogen and ammonia. Further, the heat treatment may be performed under both a nitrogen atmosphere and an oxygen atmosphere.

As a heat treatment apparatus, an electric furnace or a device for heating an object by heat conduction or heat radiation from a heating element such as a resistance heating element can be used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high temperature gas, an inert gas which does not react with an object to be processed by heat treatment, such as nitrogen or a rare gas like argon, is used.

For example, as the heat treatment, GRTA may be performed as follows. The substrate is put in an inert gas heated at a high temperature, is heated for several minutes, and is taken out of the inert gas.

As described above, the CAAC-OS substrate 100 can be formed in a relatively simple manufacturing process and has favorable crystal quality.

Accordingly, a novel light-emitting device that can be manufactured with high productivity can be provided.

Embodiment 2

In this embodiment, an example of a method for manufacturing the CAAC-OS substrate 100 which is described in Embodiment 1 is described.

A method for manufacturing the CAAC-OS substrate is described below with reference to FIG. 3 and FIGS. 4A to 4E.

Figure 3:
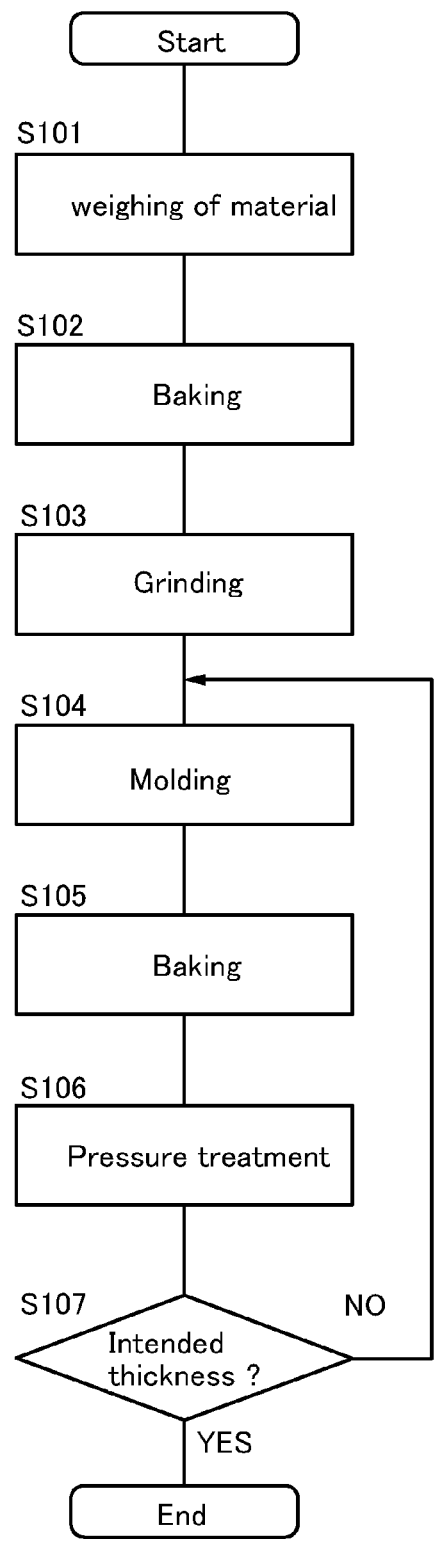
FIG. 3 is a flowchart showing an example of a method for manufacturing a CAAC-OS.

First, powder is weighed (Step S101 in FIG. 3).

Here, $InO_X$ powder, $GaO_Y$ powder, and $ZnO_Z$ powder are prepared as raw materials of the CAAC-OS substrate. Note that X, Y, and Z are each a given positive number; for example, X, Y, and Z are 1.5, 1.5, and 1, respectively. It is needless to say that the above raw materials are an example, and raw materials can be selected as appropriate in order to obtain a desired compound. Although the case where three kinds of raw materials are used is shown as an example in this embodiment, one embodiment of the present invention is not limited thereto. For example, this embodiment may be applied to the case where four or more kinds of raw materials are used or the case where one or two kinds of raw materials are used.

Next, the $InO_X$ powder, the $GaO_Y$ powder, and the $ZnO_Z$ powder are mixed at a predetermined molar ratio.

Here, the predetermined molar ratio of the $InO_X$ powder to the $GaO_Y$ powder and the $ZnO_Z$ powder is, for example, 2:2:1, 8:4:3, 3:1:1, 1:1:1, 4:2:3, 1:1:2, 3:1:4, or 3:1:2. With use of a mixed material having such a molar ratio, a CAAC-OS can be obtained easily. Note that also in the case where $MO_Y$ powder (M is Al, Ti, Y, Zr, La, Ce, Nd, or Hf) is used instead of the $GaO_Y$ powder, the molar ratio of the $InO_X$ powder to the $MO_Y$ powder and the $ZnO_Z$ powder may be 2:2:1, 8:4:3, 3:1:1, 1:1:1, 4:2:3, 1:1:2, 3:1:4, or 3:1:2. Note that the $ZnO_Z$ powder is volatilized easily in baking, and thus may be mixed at a proportion higher than that in the predetermined molar ratio.

An In—Ga—Zn—O compound is obtained by performing first baking on the mixed material of the $InO_X$ powder, the $GaO_Y$ powder, and the $ZnO_Z$ powder that are mixed at a predetermined molar ratio (Step S102 in FIG. 3).

Next, an In—Ga—Zn—O compound powder is obtained by grinding the compound (Step S103 in FIG. 3).

The In—Ga—Zn—O compound powder includes many crystal structures in a layer form when seen from the direction perpendicular to the c-axis direction. Accordingly, the In—Ga—Zn—O compound powder includes many flat-plate-like crystal particles each having a surface parallel to the a-b plane.

The first baking is performed in an inert atmosphere, an oxidation atmosphere, or a reduced-pressure atmosphere at a temperature higher than or equal to 400° C. and lower than or equal to 1700° C., preferably higher than or equal to 900° C. and lower than or equal to 1500° C. The first baking is performed for longer than or equal to 3 minutes and shorter than or equal to 24 hours, preferably longer than or equal to 30 minutes and shorter than or equal to 17 hours, more preferably longer than or equal to 30 minutes and shorter than or equal to 5 hours, for example. When the first baking is performed under the above conditions, secondary reactions other than a main reaction can be suppressed, and the concentration of an impurity contained in a compound powder 51*a* becomes lower, so that a CAAC-OS can be obtained easily later.

The first baking may be performed plural times at different temperatures and/or in different atmospheres. For example, the mixed material may be held at a first temperature in a first atmosphere and then held at a second temperature in a second atmosphere.

The baking can be performed under a nitrogen atmosphere or an atmosphere of nitrogen and ammonia. Further, the baking may be performed under both a nitrogen atmosphere and an oxygen atmosphere.

Figure 4A:
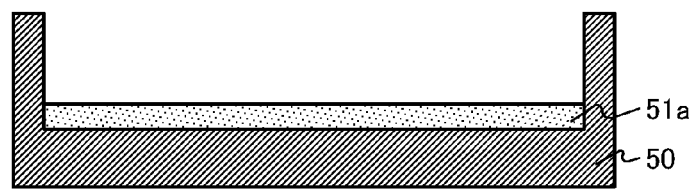
FIGS. 4A to 4E are cross-sectional views illustrating an example of a method for manufacturing a CAAC-OS.
Figure 4B:
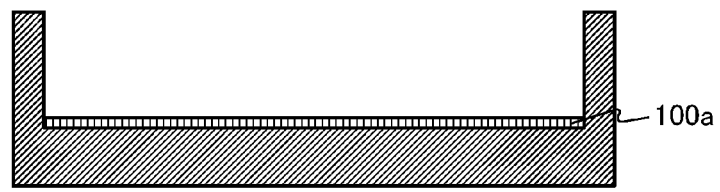

Next, as illustrated in FIG. 4A, the compound powder 51*a* which is the In—Ga—Zn—O compound powder is introduced to a mold 50 to be molded (Step S104 in FIG. 3). Note that molding refers to spreading the compound powder over a mold uniformly. For example, the compound powder is introduced to the mold, and then vibration is externally applied so that the compound powder is molded. Alternatively, the compound powder is introduced to the mold, and then molding is performed using a roller or the like so as to obtain a uniform thickness.

When the compound powder 51*a* including many flat-plate-like crystal particles is spread over the mold 50 and molded, the crystal particles are arranged with the planes parallel to the a-b plane facing upward or downward. Therefore, the proportion of the crystal structures in a layer form when seen from the direction perpendicular to the c-axis direction can be further increased by spreading and molding the obtained compound powder.

The mold 50 may be formed using a metal or an oxide and the upper shape thereof is rectangular or rounded.

Next, second baking is performed on the compound powder 51*a* (Step S105 in FIG. 3). After that, first pressure treatment is performed on the compound powder 51*a* (Step S106 in FIG. 3) which has been subjected to the second baking, and thus a CAAC-OS substrate 100*a* is obtained (see FIG. 4B). The second baking is performed using conditions and a method similar to those of the first baking. The crystallinity of the compound powder 51*a* can be enhanced by performing the second baking.

Note that the first pressure treatment may be performed in any manner as long as the compound powder 51*a* can be pressed. For example, a weight which is formed of the same kind of material as the mold 50 can be used. Alternatively, the compound powder 51*a* may be pressed under high pressure using compressed air. Besides, the first pressure treatment can be performed using a known technique. Note that the first pressure treatment may be performed at the same time as the second baking.

Planarization treatment may be performed after the first pressure treatment. As the planarization treatment, chemical mechanical polishing (CMP) treatment or the like can be employed.

The CAAC-OS substrate 100*a* obtained in such a manner has a high proportion of crystal regions in which the direction of the c-axis is parallel to a normal vector of the top surface of the CAAC-OS substrate 100*a*.

Next, the thickness of the obtained CAAC-OS substrate 100*a* is checked (Step S107 in FIG. 3). In the case where the CAAC-OS substrate 100a has a desired thickness, the process is finished, and thus the CAAC-OS substrate 100 is obtained.

Figure 4C:
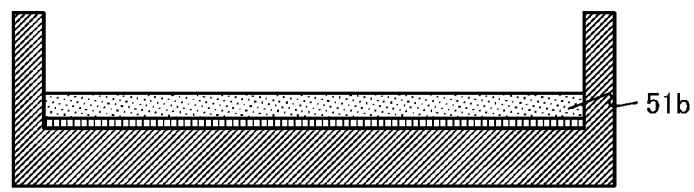
Figure 4D:
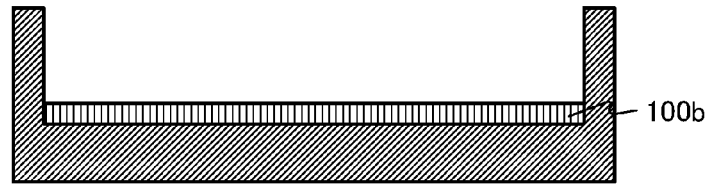

In the case where the CAAC-OS substrate 100a has a thickness smaller than a desired thickness, as illustrated in FIG. 4C, a compound powder 51b which is the In—Ga—Zn—O compound powder is put over the CAAC-OS substrate 100a to be molded (Step S104 in FIG. 3). The case where the CAAC-OS substrate 100a has a thickness smaller than a desired thickness is described below.

First, third baking is performed on the compound powder 51b and the CAAC-OS substrate 100a (Step S105 in FIG. 3). After that, second pressure treatment is performed on the compound powder 51b and the CAAC-OS substrate 100a (Step S106 in FIG. 3) which have been subjected to the third baking, whereby a CAAC-OS substrate 100b having a larger thickness than the CAAC-OS substrate 100a is obtained (see FIG. 4D). The CAAC-OS substrate 100b is obtained in such a manner that crystal growth occurs using the CAAC-OS substrate 100a as a seed crystal, and thus has a high proportion of crystal regions in which the direction of the c-axis is parallel to a normal vector of the top surface of the CAAC-OS substrate 100b.

The crystallinity of the compound powder 51b and the CAAC-OS substrate 100a can be enhanced by performing the third baking. The third baking is performed using conditions and a method similar to those of the first baking.

The second pressure treatment is performed using conditions and a method similar to those of the first pressure treatment. Through the second pressure treatment, crystal alignment in the CAAC-OS substrate 100b is improved as compared to that in the CAAC-OS substrate 100a. That is, the CAAC-OS substrate 100b has a much higher proportion of crystal regions in which the direction of the c-axis is parallel to a normal vector of the top surface of the CAAC-OS substrate 100b. This is because flat-plate-like crystal particles are arranged with the planes parallel to the a-b plane facing upward or downward by the pressure treatment. Note that the second pressure treatment may be performed at the same time as the third baking.

Next, the thickness of the CAAC-OS substrate 100b is checked (Step S107 in FIG. 3).

As described above, the thickness of the CAAC-OS can be gradually increased while the crystal alignment is improved.

Figure 4E:
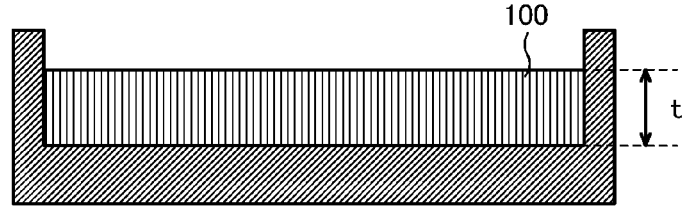

By repeating these steps of increasing the thickness of a compound film n times (n is a natural number), the CAAC-OS substrate 100 having a desired thickness (t), for example, larger than or equal to 0.1 mm and smaller than or equal to 2 mm, preferably larger than or equal to 0.3 mm and smaller than or equal to 1.1 mm can be obtained (see FIG. 4E).

Fourth baking may be performed on the obtained CAAC-OS substrate 100. The crystallinity of the CAAC-OS substrate 100 can be enhanced by performing the fourth baking. The fourth baking is performed using conditions and a method similar to those of the first baking.

Further, planarization treatment may be performed on the obtained CAAC-OS substrate 100.

The light-emitting device which is described in Embodiment 1 and illustrated in FIG. 1 can be manufactured using the CAAC-OS substrate 100.

This embodiment can be implemented in appropriate combination with any of the structures described in the other embodiment.

This application is based on Japanese Patent Application serial no. 2012-126592 filed with the Japan Patent Office on Jun. 1, 2012, the entire contents of which are hereby incorporated by reference.

What is claimed is:

1. A light-emitting device comprising:
a light-emitting layer over a substrate,
wherein the substrate comprises a c-axis aligned crystalline oxide semiconductor, and
wherein the c-axis aligned crystalline oxide semiconductor comprises indium, gallium and zinc.

2. The light-emitting device according to claim 1, wherein a surface of the substrate is formed of the c-axis aligned crystalline oxide semiconductor.

3. The light-emitting device according to claim 1, wherein the substrate is formed over a base substrate.

4. The light-emitting device according to claim 1, further comprising:
a buffer layer between the substrate and the light-emitting layer.

5. The light-emitting device according to claim 1 is a light-emitting diode.

6. A method for manufacturing a light-emitting device, comprising the steps of:
forming a substrate comprising a c-axis aligned crystalline oxide semiconductor; and
forming a light-emitting layer over the substrate,
wherein the c-axis aligned crystalline oxide semiconductor comprises indium, gallium, and zinc.

7. The method according to claim 6, wherein a surface of the substrate is formed of the c-axis aligned crystalline oxide semiconductor.

8. The method according to claim 6, wherein the substrate is formed over a base substrate.

9. The method according to claim 6, wherein the step of the formation of the light-emitting layer comprises the steps of:
forming a first clad layer over the substrate;
forming a first light-emitting layer over the first clad layer; and
forming a second clad layer over the first light-emitting layer.

10. The method according to claim 6, further comprising the step of:
forming a buffer layer over the substrate before the step of the formation of the light-emitting layer.

11. The method according to claim 6, wherein the step of the formation of the substrate comprises the steps of:
grinding a material comprising an oxide semiconductor;
molding the material after grinding;
baking the material; and
performing a pressure treatment on the material.

12. The method according to claim 11, wherein the steps of molding the material, baking the material and performing the pressure treatment are performed more than once.

13. A light-emitting device comprising:
a light-emitting layer over a substrate,
wherein the substrate comprises a c-axis aligned crystalline oxide semiconductor, and
wherein the c-axis aligned crystalline oxide semiconductor comprises indium, gallium and zinc,
wherein the light-emitting layer comprises a first clad layer, a first light-emitting layer over the first clad layer, and a second clad layer over the first light-emitting layer, and
wherein each of the first clad layer, the first light-emitting layer, and the second clad layer comprises a Group 13-15 compound semiconductor.

14. The light-emitting device according to claim 13, wherein a surface of the substrate is formed of the c-axis aligned crystalline oxide semiconductor.

15. The light-emitting device according to claim 13, wherein the substrate is formed over a base substrate.

16. The light-emitting device according to claim 13, wherein the first clad layer is an n-type semiconductor and the second clad layer is a p-type semiconductor.

17. The light-emitting device according to claim 13, further comprising:
   a buffer layer between the substrate and the light-emitting layer.

18. The light-emitting device according to claim 13 is a light-emitting diode.

* * * * *